(12) United States Patent
Zoualfaghari et al.

(10) Patent No.: US 11,962,293 B2
(45) Date of Patent: Apr. 16, 2024

(54) PASSIVE OPTICAL SENSORS

(71) Applicant: BRITISH TELECOMMUNICATIONS PUBLIC LIMITED COMPANY, London (GB)

(72) Inventors: Mohammad Zoualfaghari, London (GB); Michael Fisher, London (GB); Ian Neild, London (GB); Michael Williamson, London (GB)

(73) Assignee: British Telecommunications Public Limited Company (GB)

( * ) Notice: Subject to any disclaimer, the term of this patent is extended or adjusted under 35 U.S.C. 154(b) by 812 days.

(21) Appl. No.: 15/733,642

(22) PCT Filed: Mar. 18, 2019

(86) PCT No.: PCT/EP2019/056725
§ 371 (c)(1),
(2) Date: Sep. 23, 2020

(87) PCT Pub. No.: WO2019/179951
PCT Pub. Date: Sep. 26, 2019

(65) Prior Publication Data
US 2021/0005078 A1    Jan. 7, 2021

(30) Foreign Application Priority Data
Mar. 23, 2018    (EP) .................................... 18163794

(51) Int. Cl.
*G08B 29/10* (2006.01)
*G08B 5/36* (2006.01)
*H03K 17/687* (2006.01)

(52) U.S. Cl.
CPC ............. *H03K 17/687* (2013.01); *G08B 5/36* (2013.01); *G08B 29/10* (2013.01)

(58) Field of Classification Search
CPC ......... H03K 17/687; G08B 5/36; G08B 29/10
See application file for complete search history.

(56) References Cited

U.S. PATENT DOCUMENTS 3,778,150 A    12/1973 Aston
5,293,505 A    3/1994 Ogawa
(Continued)

FOREIGN PATENT DOCUMENTS

CN    2605700 Y    3/2004
CN    101459995 A    6/2009
(Continued)

OTHER PUBLICATIONS

Haidar Sajjad., "Simple Circuit Overcomes MOSFET Gate Threshold Voltage Challenge," Electronic Design, Dec. 17, 2014, XP055518477, 3 pages.
(Continued)

*Primary Examiner* — Andrew Sasinowski
(74) *Attorney, Agent, or Firm* — Pranger Law PC

(57) ABSTRACT

A passive sensor for detecting the operation of a light source includes a photosensor which, when illuminated by the light source, delivers a voltage to a field effect transistor (FET) which can switch a circuit to control a device at a remote location. The FET transitions rapidly between very low resistance (short circuit) and very high resistance (open circuit), allowing a binary indication to be given in the circuit. The circuit can be used to charge an electrical storage device to allow later download of recent status of the lamp by detecting the charge stored in the device.

11 Claims, 12 Drawing Sheets

(56) References Cited

U.S. PATENT DOCUMENTS

| | | | |
|---|---|---|---|
| 5,612,582 A | 3/1997 | Shichi et al. | |
| 5,693,952 A * | 12/1997 | Cox | A61N 1/3931 327/434 |
| 6,175,196 B1 | 1/2001 | Ragner et al. | |
| 6,768,244 B2 * | 7/2004 | Ong | H02K 55/04 310/254.1 |
| 2003/0107322 A1 | 6/2003 | Melvin et al. | |
| 2014/0009199 A1 * | 1/2014 | Ohmaru | H03K 3/012 327/198 |
| 2015/0263725 A1 * | 9/2015 | Onuki | H01L 29/78693 327/108 |
| 2016/0006433 A1 * | 1/2016 | Ishizu | H03K 19/0008 327/427 |
| 2016/0014872 A1 | 1/2016 | Joyce et al. | |
| 2016/0190379 A1 | 6/2016 | Shiraishi | |

FOREIGN PATENT DOCUMENTS

| | | |
|---|---|---|
| CN | 201630990 U | 11/2010 |
| CN | 202276330 U | 6/2012 |
| CN | 203733234 U | 7/2014 |
| CN | 205015086 U | 2/2016 |
| CN | 205485752 U | 8/2016 |
| CN | 205693797 U | 11/2016 |
| CN | 206114698 U | 4/2017 |
| CN | 206807819 U | 12/2017 |
| GB | 1212590 A | 11/1970 |
| JP | H11211564 A | 8/1999 |
| JP | 2001004441 A | 1/2001 |
| KR | 20010062600 A | 7/2001 |
| WO | WO-2011025688 A1 | 3/2011 |

OTHER PUBLICATIONS

Light dependent resistors, NSL19-M51 RS stock No. 596-141, 232-3816, Mar. 1997.

"Communication pursuant to Article 94(3) EPC for European Application No. 19709991.4, dated Sep. 16, 2022", 7 pages.

"Examination Report under Section 18(3) for Great Britain Application No. 1804736.5, dated May 16, 2022", 5 pages.

"Examination Report Under Section 18(3) for Great Britain Application No. GB1804736.5, dated Apr. 21, 2021", 5 pages.

"International Preliminary Report on Patentability for Application No. PCT/EP2019/056725, dated Oct. 8, 2020", 9 pages.

"International Search Report and Written Opinion received for PCT Patent Application No. PCT/EP2019/056725, dated Jun. 5, 2019", 12 pages.

"Office Action received for Chinese Patent Application No. 201980017162.7, dated Jul. 26, 2022", 16 pages (9 pages of English Translation and 7 pages of Official Copy Only).

"Office Action received for Chinese Patent Application No. 201980017162.7, dated Jun. 3, 2021", 15 pages (8 pages of English Translation and 7 pages of Official Copy Only).

Zhou T., et al., "Illumination Design—From Traditional Light Sources to LEDs", Fudan University Press, in the formal text, Dec. 31, 2015, 26 pages.

* cited by examiner

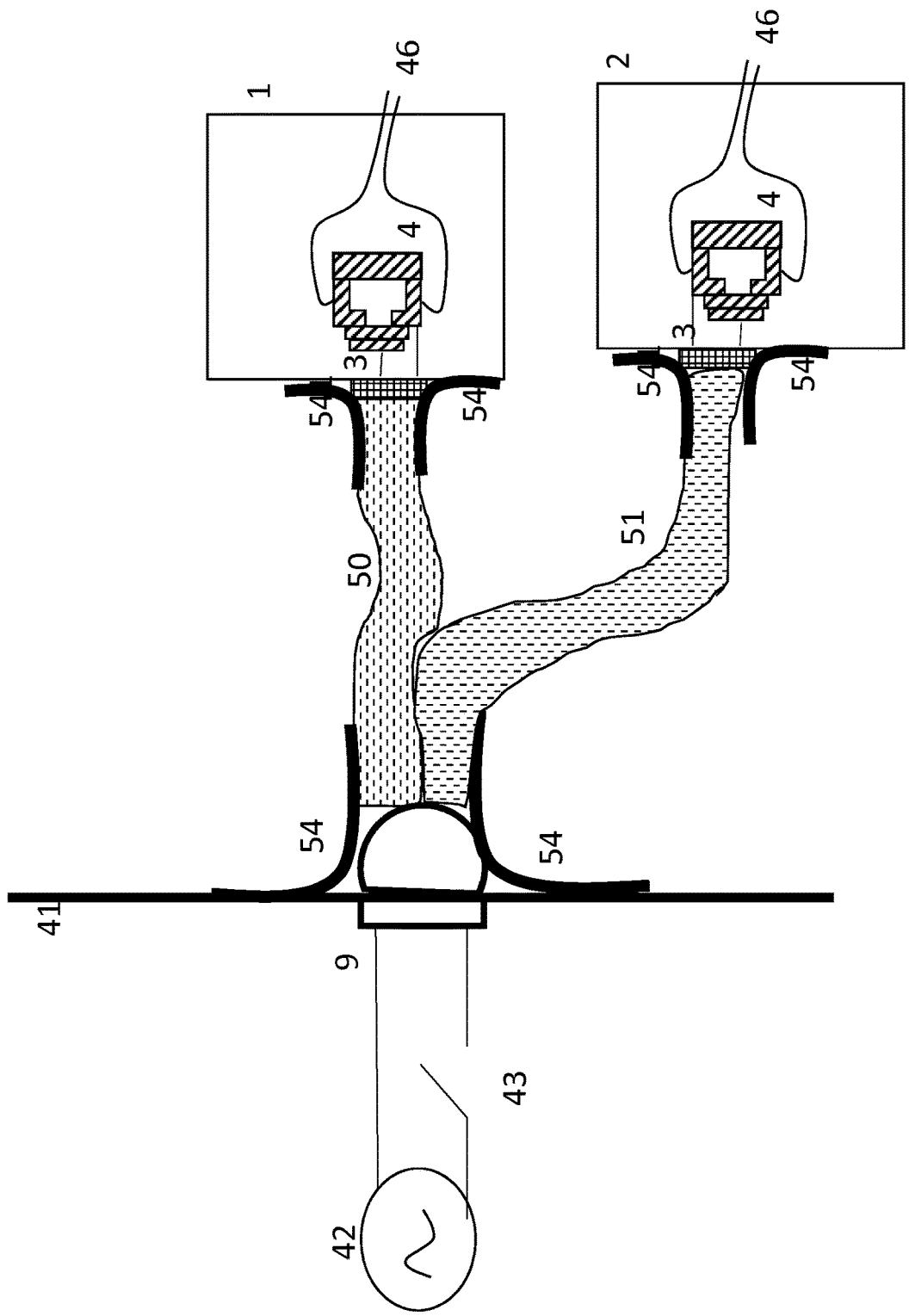

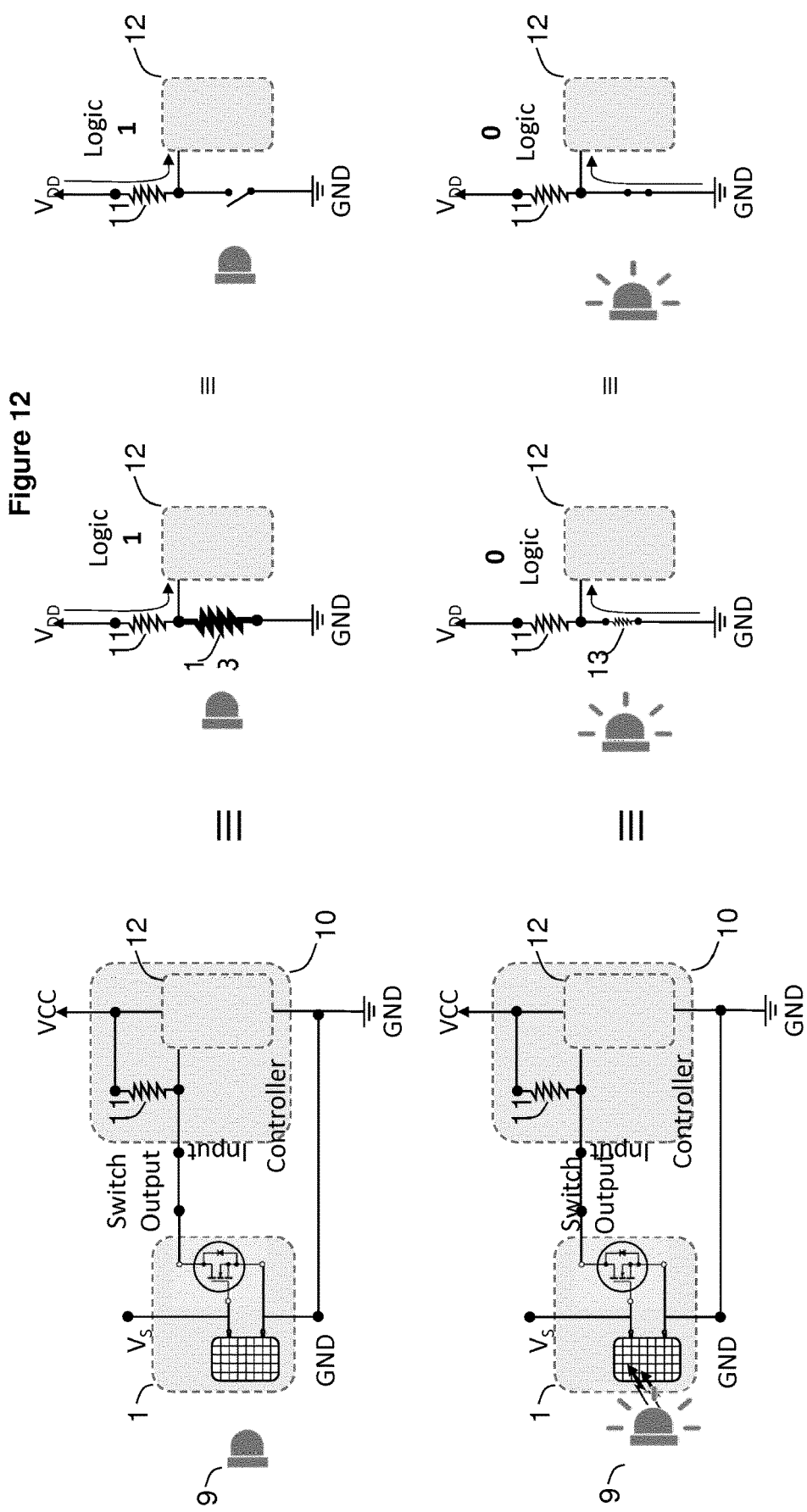

PASSIVE OPTICAL SENSORS

PRIORITY CLAIM

The present application is a National Phase entry of PCT Application No. PCT/EP2019/056725, filed Mar. 18, 2019, which claims priority from EP Patent Application No. 18163794.3, filed Mar. 23, 2018, which is hereby fully incorporated herein by reference.

FIELD

This disclosure relates to passive optical sensors, and in particular relates to a sensor designed to allow automated monitoring of a human-readable status indicator such as an alert lamp turning on, or an ON/OFF indicator LED. Monitoring requires relay contacts to open and close to generate an indication of whether the machine is running or not.

BACKGROUND

It would be possible to use a powered circuit to monitor the circuit powering the human-readable indicator light and create a switched output. A particular problem exists when it is desired to remotely monitor existing "legacy" equipment which was not provided on installation with the necessary interfaces to allow remote monitoring circuitry to be connected. Such equipment often runs at mains voltages and making a connection would require a suitably-qualified person to switch off the unit, open it up (potentially exposing the operator to electrical, chemical, or other hazards), perform some rewiring, possibly also requiring conversion of mains to safe voltages, and perhaps drilling the case and fitting connectors. This can be impractical, and for older undocumented equipment may risk causing inadvertent changes to other internal equipment in the same casing, such as movement of other components or unintended changes to electrical circuitry. There may also be limited space within the housing to accommodate the necessary equipment, particularly if a step-down transformer is required.

Such a monitoring system with human-readable indicators is shown in FIG. 1. Illustratively, an equipment housing 41 incorporates a number of dials 2, 3 and indicator lights 9, 90, 91, indicating operating parameters of the equipment within. As indicated by a warning sign 40 on the exterior of the housing, the equipment within the housing may represent a hazard such as high electrical voltages or hazardous chemicals. Because of such hazards, or the need to interrupt the operation of the equipment, it is often undesirable to open up such equipment.

In this illustrative schematic, the indicator light 4 is a light that is illuminated when the machine is running. In other equipments, a light is illuminated when a fault occurs. Embodiments of this invention are configured to monitor such indicator lights, for example to trigger an alarm at a remote location if the machine stops running. To achieve this, it is desired to generate an output that behaves as a switch. An existing passive component called a "light dependent resistor" is known to be used to monitor a human-readable lamp. However, the resistance changes at the low light levels emitting from human-readable indicators are very small; typically 3 kilohms when lit to 14 kilohms when dark. Such a system also requires a power supply to apply a voltage across the resistor so that changes in resistance can be measured. The resistance typically varies linearly with incident light, which can result in ambiguous outputs. It is desirable that an output behaves electronically more like an on-off switch, typically changing resistance by several orders of magnitude, between less than 10 ohms (circuit complete) to several megohms (circuit open).

SUMMARY

According to the disclosure, there is provided a transducer for detecting the state of a light source, comprising a passive photoelectric sensor generating an electric potential in response to incident light, coupled to a field-effect transistor which switches between distinct on and off states at a threshold potential, wherein the field effect transistor is connected to an electrical storage device arranged to be charged up by the photoelectric sensor, and to be discharged to a further circuit. The states may be defined in terms of resistance, wherein one state is a resistance of the order of megohms and the other is of the order of less than 100 ohms. The field effect transducer may be an enhancement-mode or depletion-mode metal-oxide-semiconductor field-effect transistor (e-MOSFET or d-MOSFET).

The photoelectric sensor may be mounted in a housing shaped to enclose an indicator lamp and exclude light from other sources from reaching the photoelectric sensor. The housing may be fitted with magnets to secure it to an instrument housing.

The photoelectric sensor may be optically coupled to a light pipe, the light pipe being arranged, at its end remote from the sensor, to be coupled to an indicator lamp.

The photoelectric sensor may be responsive to a first wavelength of light to generate a current and not responsive to a second wavelength of light, so that the sensor will respond to a change in color of the indicator light. This may be provided by fitting the photoelectric sensor with an optical filter. Alternatively, two or more transducers may be used, each including respective photoelectric sensors responsive to different wavelengths.

The use of a field effect transistor (FET) allows effective sensing of the condition of an indicator light without the need for an independent power supply, because the sensor is passive. A FET needs much less energy to be switched than a bipolar junction transistor requires. The inventors have experimented with large area photo diodes co-operating with transistors, photo diodes, photo transistors; but none of them could deliver enough resistance swing or current to act as a proper "switch".

Moreover, the output of a FET transitions rapidly between very low resistance—short circuit—and very high resistance—open circuit. This is different from Light Dependent Resistors (LDR) whose resistance changes continuously with changes in light density. FETs also provide a much larger relative change in resistance for a small change in voltage, such as that capable of being delivered by a photocell having only an indicator light as a source of light.

In its simplest form, an embodiment of the invention provides a sensor and transmitters requiring no power supply or battery, using only the power generated from the light from the indicator panel to transmit the data.

Other embodiments of the disclosure may be used to power a battery-operated sensor and transmitter, using the sensor to charge a rechargeable battery, so that if the lamp then ceases to be illuminated, the battery starts to discharge, the discharge current being used to transmit a message alerting an operator of the anomaly.

Embodiments of the disclosure may also be used to drive a passive optical switch, by providing a voltage difference (instead of resistance) to indicate 0 or 1 (e.g. 0V and 5V).

BRIEF DESCRIPTION OF THE DRAWINGS

FIG. 7 depicts an installation incorporating two of the sensors of the embodiment of FIG. 6.

FIG. 12 depicts a first implementation of an embodiment of the disclosure.

DETAILED DESCRIPTION

Figure 1:
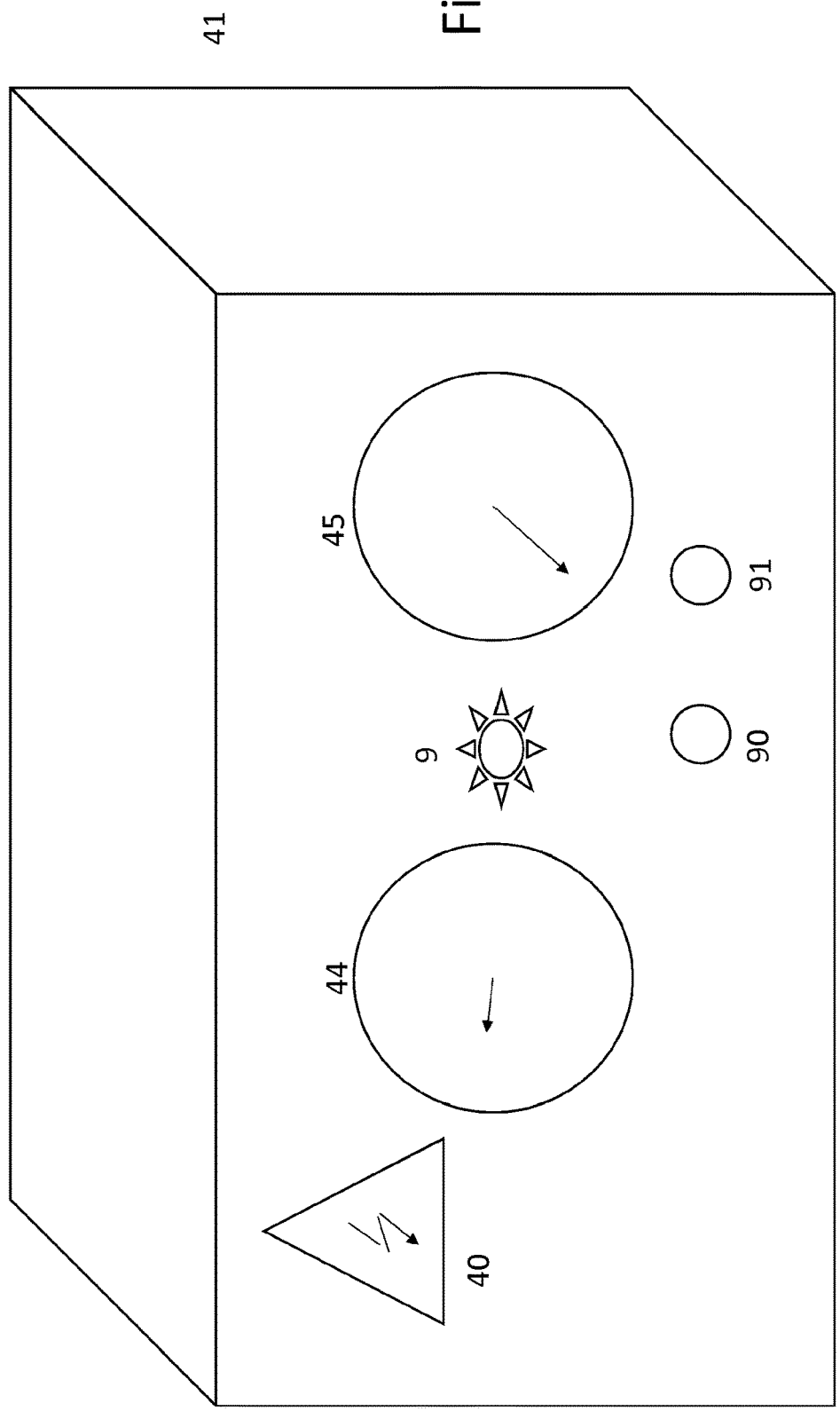
FIG. 1 depicts a typical equipment cabinet to which a sensor of the disclosure may be applied.
Figures 2, 3:
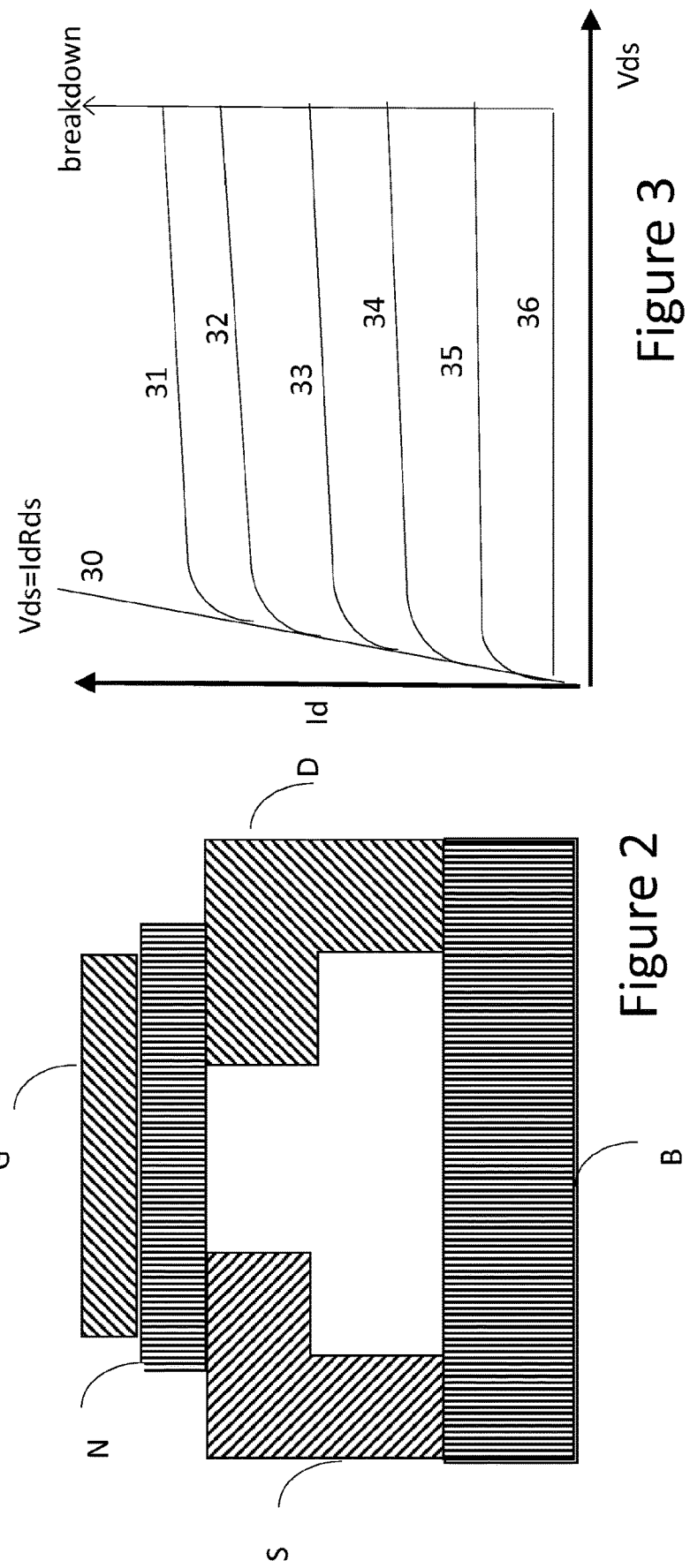
FIG. 2 depicts the general arrangement of a metal-oxide-semiconductor field-effect transistor (MOSFET).
FIG. 3 depicts the characteristics of a an enhancement-mode MOSFET.

To assist in understanding the embodiments of the disclosure, the characteristics of metal-oxide-semiconductor field-effect transistors (MOSFETs) will briefly be discussed, with reference to FIGS. 2 and 3.

FIG. 2 is a schematic diagram of a MOSFET, depicting its key elements, the body (B), and the drain (D), source (S) and gate (G) terminals (the latter three approximately corresponding respectively to the collector, emitter and base of a bipolar junction transistor). The gate G is separated from the body B by an insulating layer (N). The metal-oxide-semiconductor field-effect transistor is a type of field-effect transistor (FET), most commonly fabricated by the controlled oxidation of silicon. It has an insulated gate, whose voltage determines the conductivity of the device. This ability to change conductivity with the amount of applied voltage can be used for amplifying or switching electronic signals.

MOSFETs make very good electronic switches for controlling loads and in CMOS digital circuits as they operate between their cut-off and saturation regions.

The major types of field-effect transistor, are known as depletion mode and enhancement mode, differentiated by whether the transistor is in an ON state or an OFF state at zero gate-source voltage. They can further be differentiated by whether p-type or n-type semiconductors are used for the drain and source, the devices being known respectively as PMOS and NMOS. Enhancement-mode MOSFETs are off at zero gate-source voltage. NMOS devices can be turned on by pulling the gate voltage higher than the source voltage whilst, conversely, PMOS devices can be turned on by pulling the gate voltage lower than the source voltage. In most circuits, this means pulling an enhancement-mode MOSFET's gate voltage towards its drain voltage turns it ON.

Depletion-mode MOSFETs can be turned on by pulling the gate voltage lower than the source voltage. The device is normally ON at zero gate-source voltage. Such devices are used as load "resistors" in logic circuits (in depletion-mode NMOS logic, for example). For N-type depletion-mode devices, the threshold voltage might be about −3 V, so it could be turned off by pulling the gate 3 V negative (the drain, by comparison, is more positive than the source in NMOS). In PMOS, the polarities are reversed.

The mode can be determined by the sign of the threshold voltage: for an N-type FET, enhancement-mode devices have positive thresholds, and depletion-mode devices have negative thresholds; for a P-type FET, enhancement-mode negative, depletion-mode positive.

The N-channel, Enhancement-mode MOSFET (e-MOSFET) operates using a positive input voltage and has an extremely high input resistance (almost infinite) making it possible to interface with nearly any logic gate or driver capable of producing a positive output. Due to this very high input (Gate) resistance we can safely parallel together many different MOSFETS until we achieve the current handling capacity that we required.

The operation of an enhancement-mode MOSFET, or e-MOSFET, can best be described using its characteristic curves shown in FIG. 3.

The minimum ON-state gate voltage required to ensure that the MOSFET remains "ON" when carrying the selected drain current can be determined from the V-I transfer curves depicted in FIG. 3, each of the curves 30, 31, 32, 33, 34 represent the plot of drain current Id against drain/source voltage Vds for a respective value of gate/source voltage Vgs. It will be seen that for small values of Vgs (e.g. below curve 36) the slope of these curves is linear and very shallow, representing a very high resistance (drain current varies very slowly with voltage). However, for sufficiently high values of Vgs (curve 30) a very steep gradient is seen, representing a very low resistance. Thus there is a very abrupt transition between very low resistance (effectively a completed circuit) and a very high resistance (open circuit), making a MOSFET very suitable as a switch responsive to a change in voltage, regardless of the magnitude of that change. By applying a suitable drive voltage Vgs to the gate of a FET, the resistance of the drain-source channel, RDs (on) can be varied from an "OFF-resistance" of many hundreds of kΩ, (curve 36) effectively an open circuit, to an "ON-resistance" of less than 1Ω, effectively acting as a short circuit (curve 30), so the MOSFET will behave as a "single-pole single-throw" (SPST) solid state switch. This ability to turn the power MOSFET "ON" and "OFF" allows the device to be used as a very efficient switch with switching speeds much faster than standard bipolar junction transistors.

In embodiments of the present disclosure, a photocell illuminated by the indicator lamp to be monitored supplies the voltage Vgs, and is used to switch another circuit.

Figure 4:
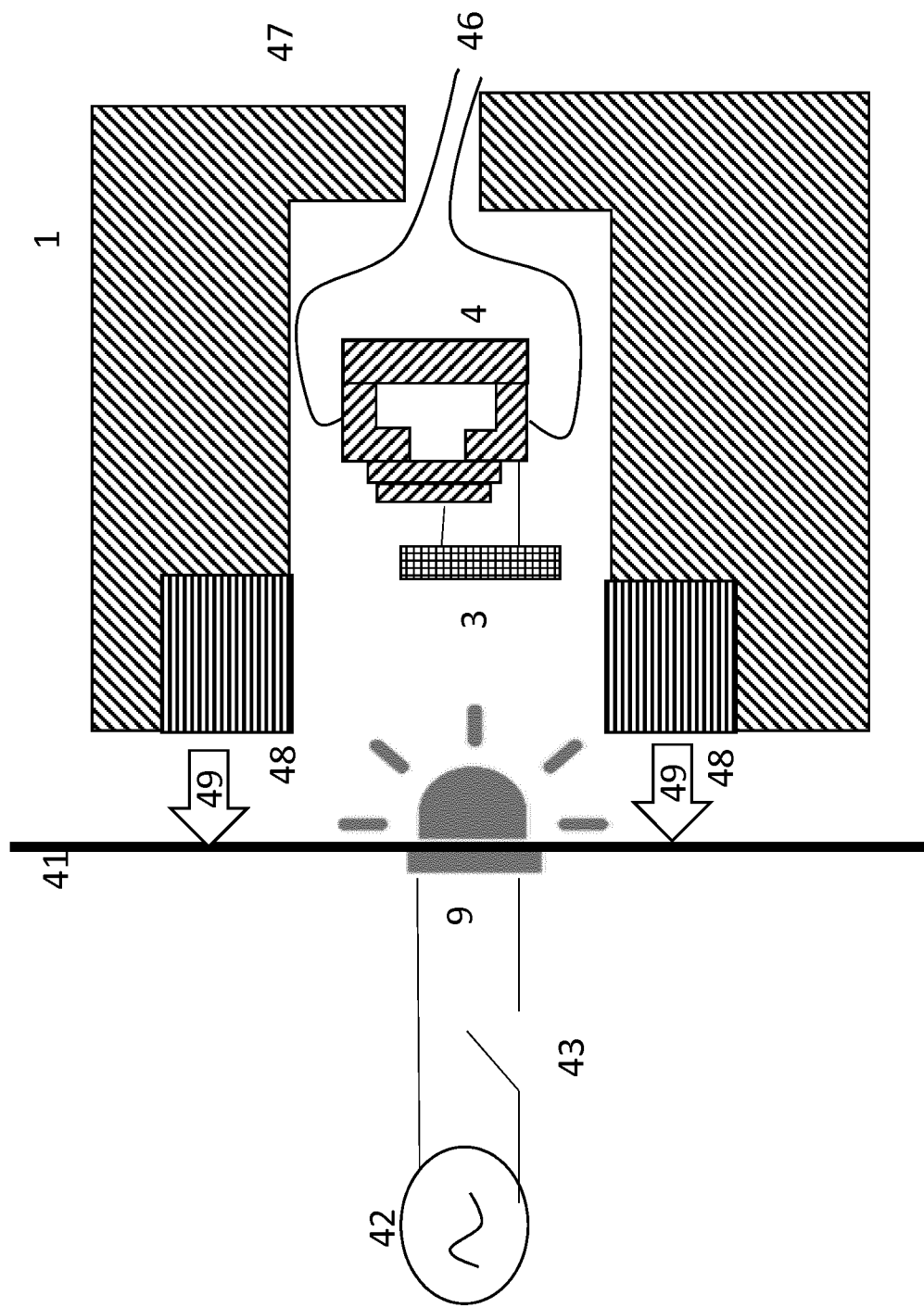
FIG. 4 depicts a first embodiment of a sensor according to the disclosure.

FIG. 4 is a cross-section through a sensor assembly of one embodiment of the disclosure, together with an indicator lamp mounted in a housing, whose condition is to be monitored by the sensor. For clarity the sensor is shown spaced from the housing to which it is to be attached.

The indicator lamp 9, which may be an incandescent bulb, an LED, or any other illuminated indicator, is mounted in a housing 41. The lamp 9 is controlled by electrical circuitry 42. The sensor assembly 1 is provided to allow the state (illuminated/not illuminated) of the lamp 9 to be monitored remotely without having to penetrate the housing 41 or modify the circuitry 42.

The sensor itself comprises a photosensitive receptor 3 such as a CPC1831N solar cell. The receptor 3 is connected to the ground and source terminals of a field-effect transistor FET 4/5 (shown in more detail in FIGS. 2, 7 and 8). A suitable FET would be a 2N7000 N-Channel e-MOSFET. The FET is connected to a remote monitoring location by way of an electrical connection 46. The photosensor 3 is enclosed on all sides, except that which is to face the lamp 9, by a non-transparent housing 47 to prevent ambient light affecting the photosensor 3. In some embodiments this material is flexible so that a light-tight seal can be made with the equipment housing 41. The sensor assembly 1 is secured to the equipment housing by a suitable attachment means 48, preferably of a kind which does not cause damage to the equipment housing 41 but will provide a firm attachment so that the light-tight housing 47 is held against the equipment housing 41, as depicted by the arrows 49. An adhesive may be used or, if the housing 41 is made of steel, magnets 48 may be used to attach the assembly 1. Having a unit attach externally by magnets means there is no hazard, a lower skill level required and no downtime on the monitored device.

The sensor assembly 1 is mounted on the equipment housing 41 so that light from the indicator lamp energizes the photosensor 3, causing the MOSFET 4 to operate to open the circuit 46 when the indicator lamp is not lit and to close the circuit when it is lit (or vice versa for a reverse logic sensor). An 8-volt solar cell allows energy to be generated, from the light emitted by a typical indicator lamp, sufficient to turn a FET on/off. The FET 4 therefore switches the circuit 46 in tandem with the switch 43 controlling the circuit 42 which illuminates the lamp 9.

Figure 6:
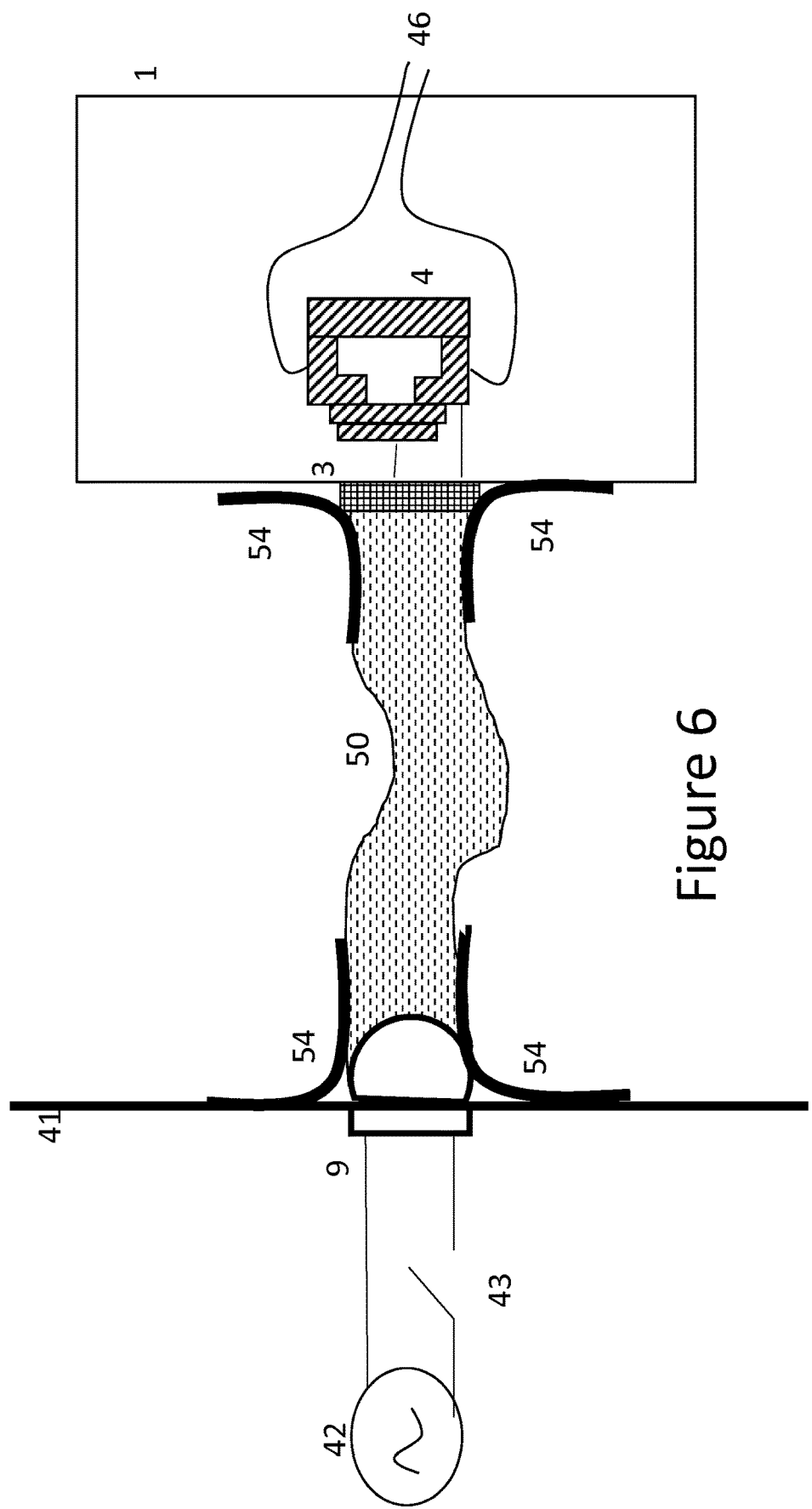
FIG. 6 depicts a second embodiment of a sensor according to the disclosure.

FIG. 6 depicts an alternative arrangement, in which the photosensor 3 can be located at a distance from the lamp. An optical pipe (a piece of transparent material) is attached to the photosensor 3 at one end and secured to the lamp 9 at its other end so that light from the lamp is coupled to the photosensor. As shown, the pipe is secured to the equipment housing 41 and the sensor assembly 1 by light absorbent adhesive tape 54, limiting limit light from outside getting onto the photosensor 3).

Figure 8:
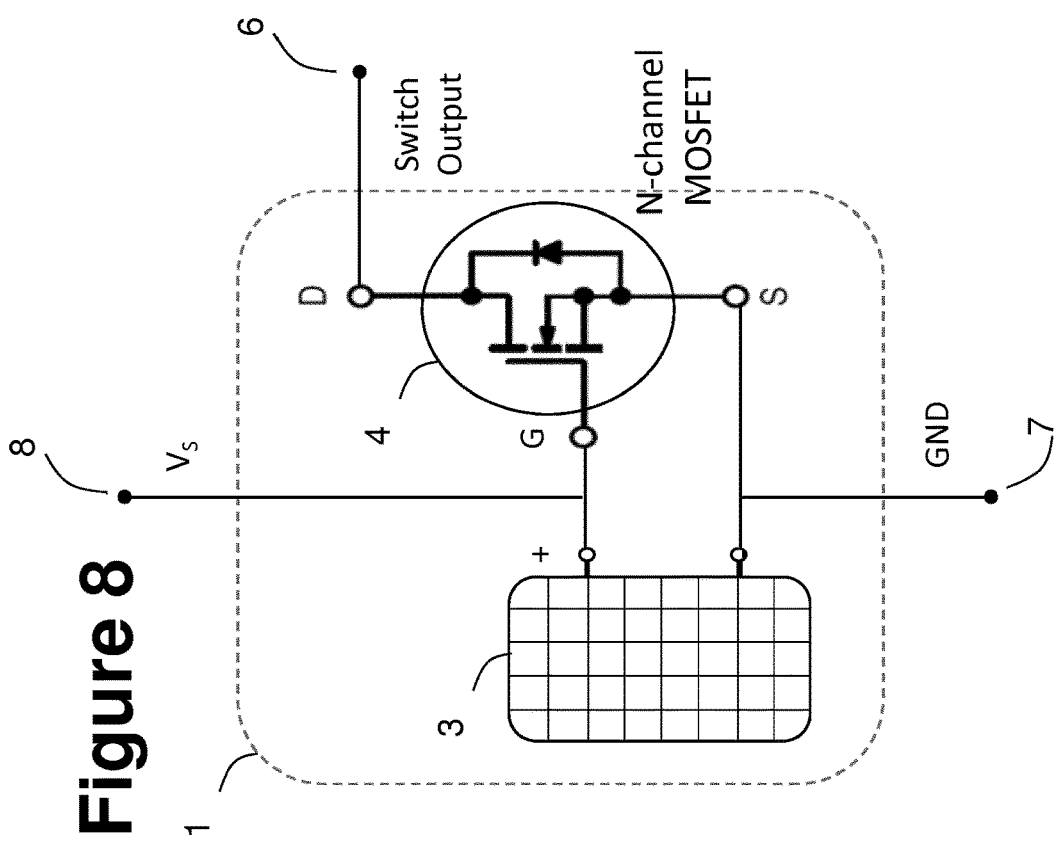
FIG. 8 depicts a first embodiment of the disclosure.

In the embodiment of the invention shown in FIG. 8, an electrical storage device 14 is depicted as a capacitor, but an accumulator or battery could be used. A P-channel depletion-mode MOSFET can be used in this embodiment. The device is normally ON at zero gate-source voltage. This MOSFET requires the Gate-Source voltage, (VGS) to switch the device "OFF". The depletion mode MOSFET is equivalent to a "Normally Closed" switch. The accumulator is charged by the energy generated by the photosensor 3. When the lamp 9 is extinguished, the accumulator begins to discharge. Diodes 15, 16, or an equivalent circuit, direct the current during charging and discharging through different circuits which operate alarms. One or both diodes 15, 16 may be light-emitting diodes indicating the charging state of the accumulator 14 and thus the state of the remote lamp 9.

Figure 9:
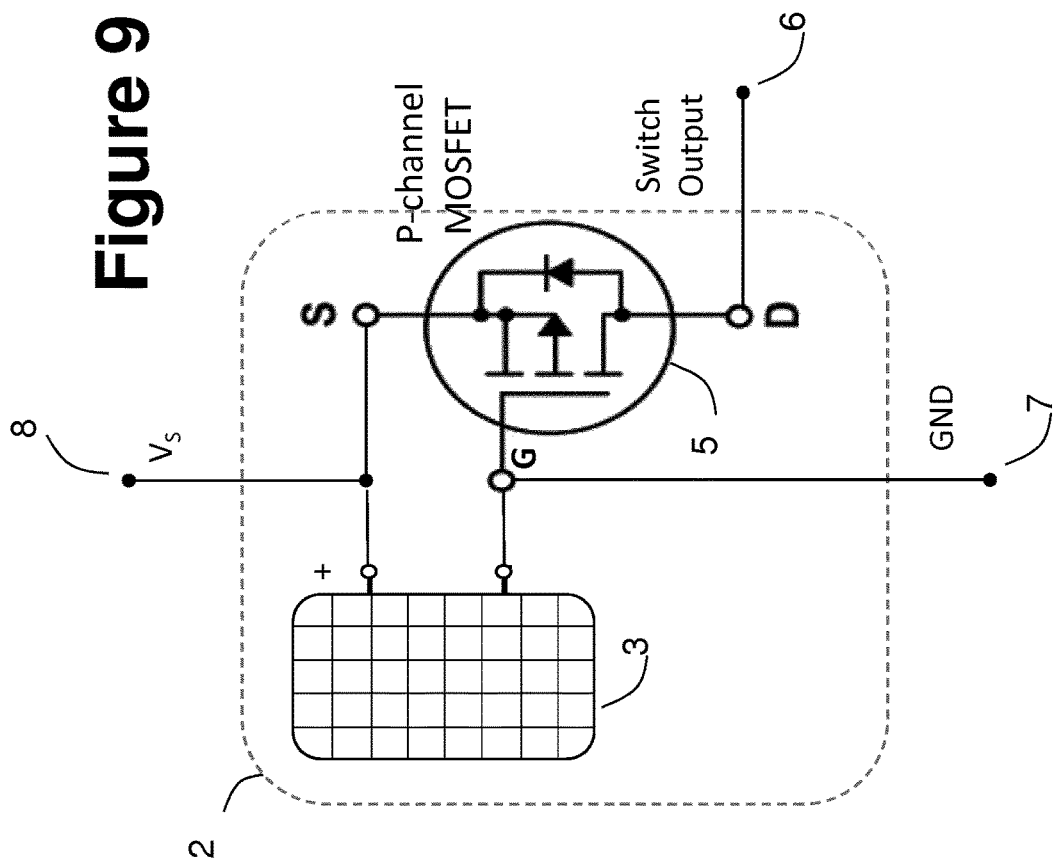
FIG. 9 depicts a second embodiment of the disclosure.

FIG. 9 depicts a further embodiment in which the electrical storage device 14 is charged up, either when the lamp 9 is illuminated ((direct logic) or when it is not (reverse logic). The state of charge of the accumulator 14 will depend on the number and length of episodes when the sensor 2 is delivering power, and this can be interrogated when required by switching in (17) a measuring device such as a voltmeter or threshold detector circuit (18).

The remaining FIGS. 10 to 15 describe the logical operation of respectively direct and reverse logic implementations of the principle of this disclosure.

|  | LED OFF | LED ON |
|---|---|---|
| 1. Reverse Logic: | | |
| High Output | X | |
| Low Output | | X |
| 2. Direct Logic: | | |
| High Output | | X |
| Low Output | X | |

Figure 11:
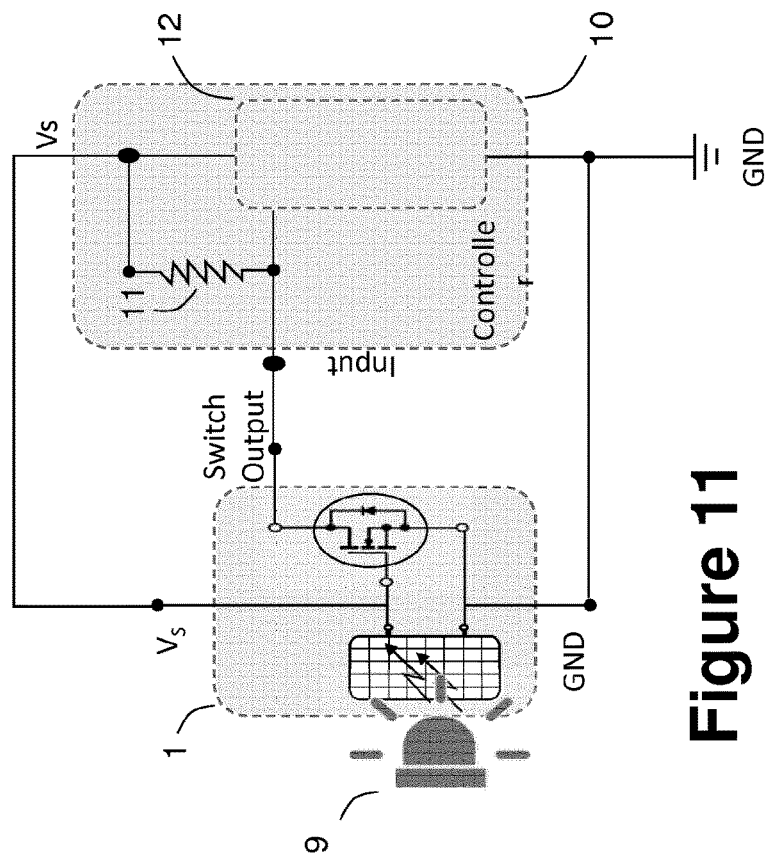
FIG. 11 depicts a variant of the sensor circuit of FIG. 10 the disclosure.
Figure 10:
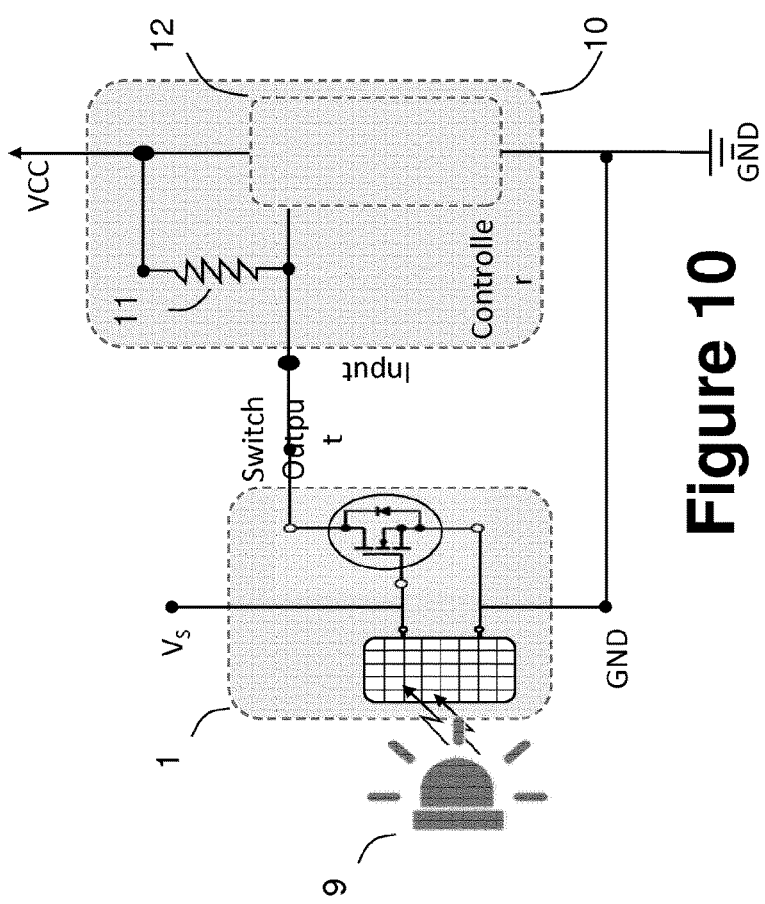
FIG. 10 depicts a sensor circuit illustrating the principle of the disclosure.

FIG. 10 illustrates circuitry for a reverse logic implementation of the embodiment of FIG. 4, using an N-Channel e-MOSFET, (4) whilst FIG. 11 illustrates modified circuitry for a direct logic variant 2 of the embodiment of FIG. 4, using a P-Channel e-MOSFET (5). In both figures the switch (6), ground (7) and supply (8) connections are indicated—note that in the reverse logic embodiment (FIG. 10) the supply connection 8 is connected to the gate terminal of the FET, and the source terminal is grounded, whereas in the direct logic embodiment of FIG. 11 these connections are reversed. The switch output 6 is connected to the drain terminal D in both cases.

Figure 13:
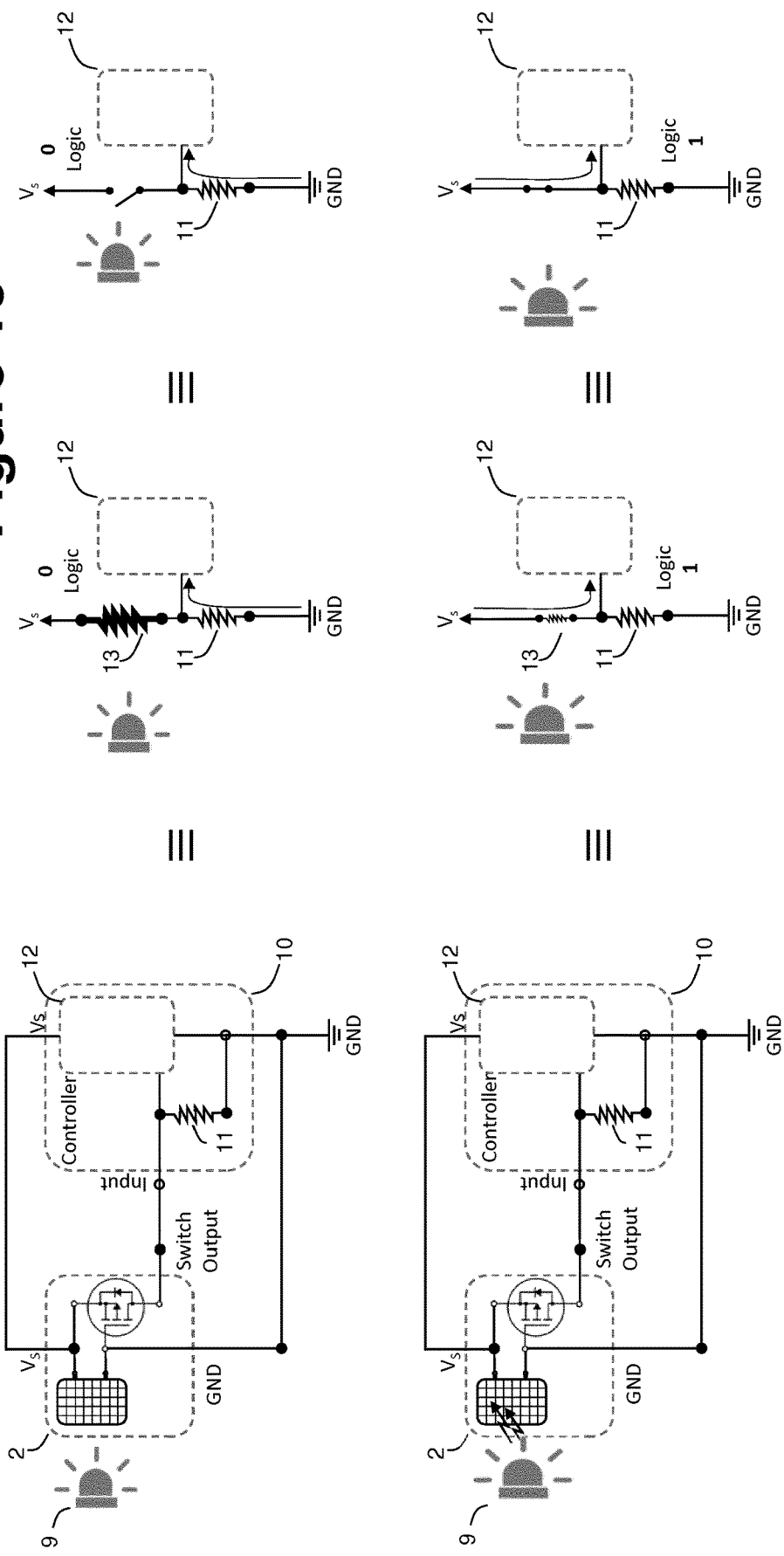
FIG. 13 depicts a second implementation of an embodiment of the disclosure.

FIG. 12 depicts an arrangement in which a reverse-logic sensor 1 switches a controller 10; and FIG. 13 shows the same reverse-logic sensor 1 in another arrangement. In these Figures the controller 10 is represented as a built-in pull up/down resistor 11 and driver/processor/transmitter circuit 12. In both embodiments the controller 10 is powered up when the LED/Lamp (9) turns on. In FIG. 13 the supply voltage (8) (delivered from the photocell 3) is used to power up the components of the controller 10, whereas in FIG. 12 it switches the controller which has an independent power source VCC.

Figure 14:
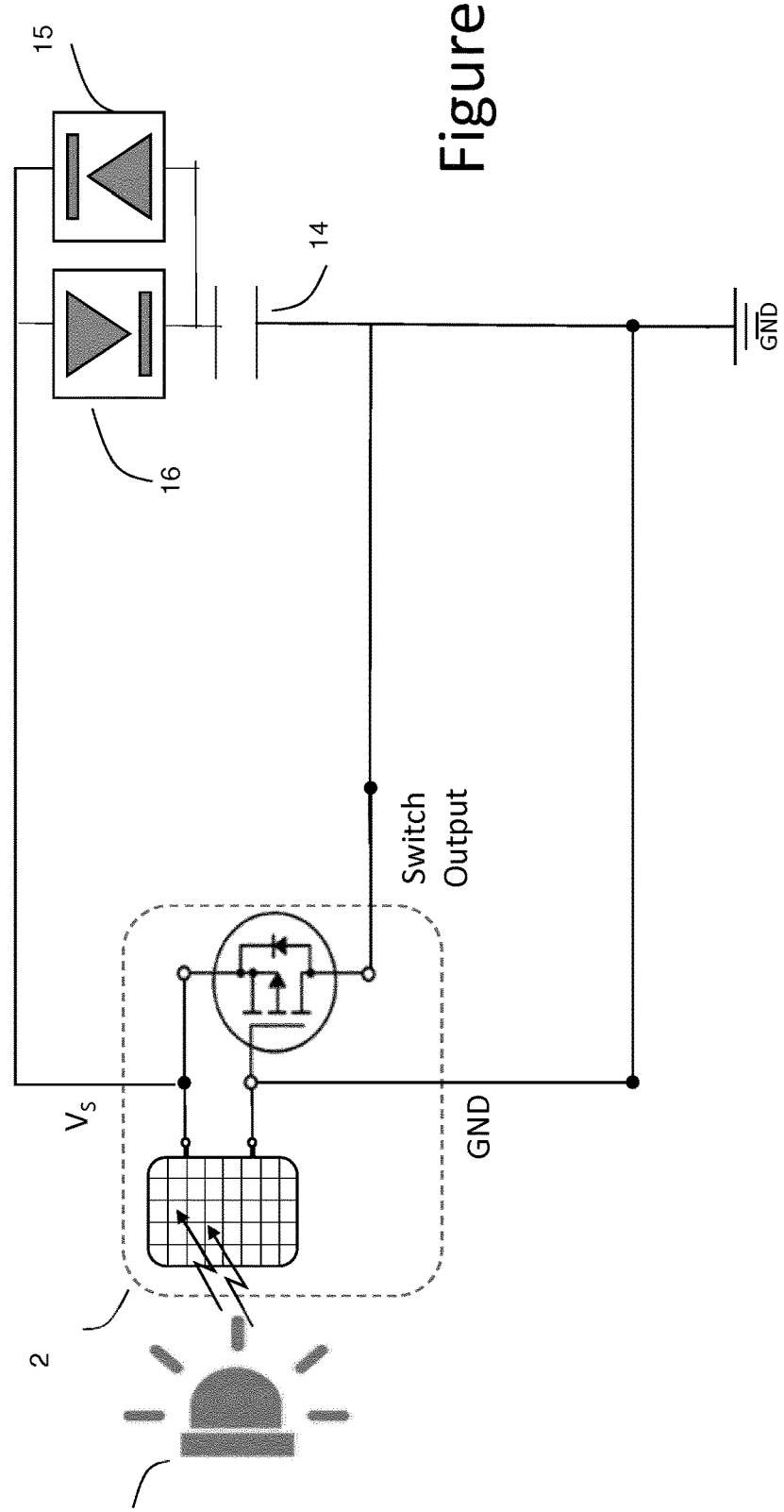
FIG. 14 depicts the circuit of FIG. 12 in operation.

FIG. 14 shows how two statuses of LED (9) affect the reverse-logic sensor (1) output. The upper diagram depicts the sensor system and an equivalent circuit when the lamp 9 is unlit and the lower diagram depicts the same when the lamp is lit.

As the voltage between the gate (G) and source (S) pins changes, the potential at the Drain (D) pin connected to the switch output 6 switches between ground and the maximum (supply) voltage Vs.

In the unlit condition the photocell 3 generates no voltage between the gate and source terminals G, S, driving the potential at the switch output 6 high. This is equivalent to a high resistance 13 (or open switch) between the source pin (connected to ground) and the switch output, driving the input to the processor high and generating a logical "1".

Illuminating the lamp 9 raises the potential at the gate terminal close to that of the drain terminal (switch connection 6) driving the potential at the switch output 6 low which reduces the potential between the processor input and ground—equivalent to reducing the resistance 13 or closing a switch, thus generating a logical "0".

Figure 15:
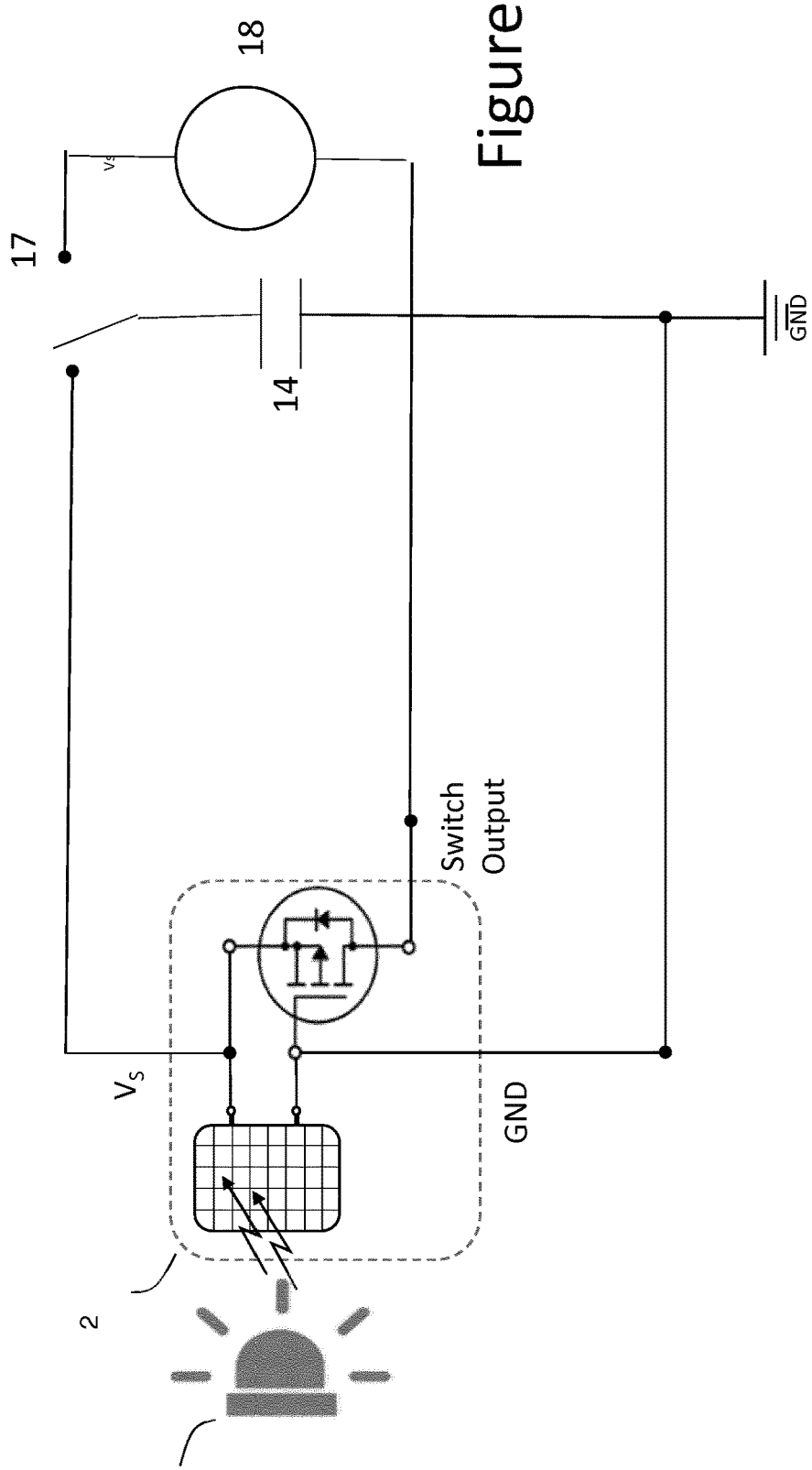
FIG. 15 depicts the circuit of FIG. 13 in operation.

FIG. 15 shows how two statuses of LED (9) affect the direct-logic sensor (2) output. The upper diagram depicts the sensor system and an equivalent circuit when the lamp 9 is unlit and the lower diagram depicts the same when the lamp is lit.

As the voltage between the gate (G) and drain (D) pins changes, the potential at the Drain (D) pin connected to the switch output 6 switches between ground and the maximum (supply) voltage Vs.

In the unlit condition the photocell 3 generates a high voltage between the gate and drain terminals G, D, driving the potential at the gate (switch) output 6 high. This is equivalent to a high resistance 11 (or open switch) between the gate pin (connected to ground) and the switch output, driving the input to the processor low and generating a logical "0".

Illuminating the lamp 9 lowers the potential at the gate terminal close to that of the drain terminal (switch connection 6) driving the potential at the switch output 6 low which lowers the potential between the processor input and ground—equivalent to reducing the resistance 13 or closing a switch, thus generating a logical "1".

Figure 5:
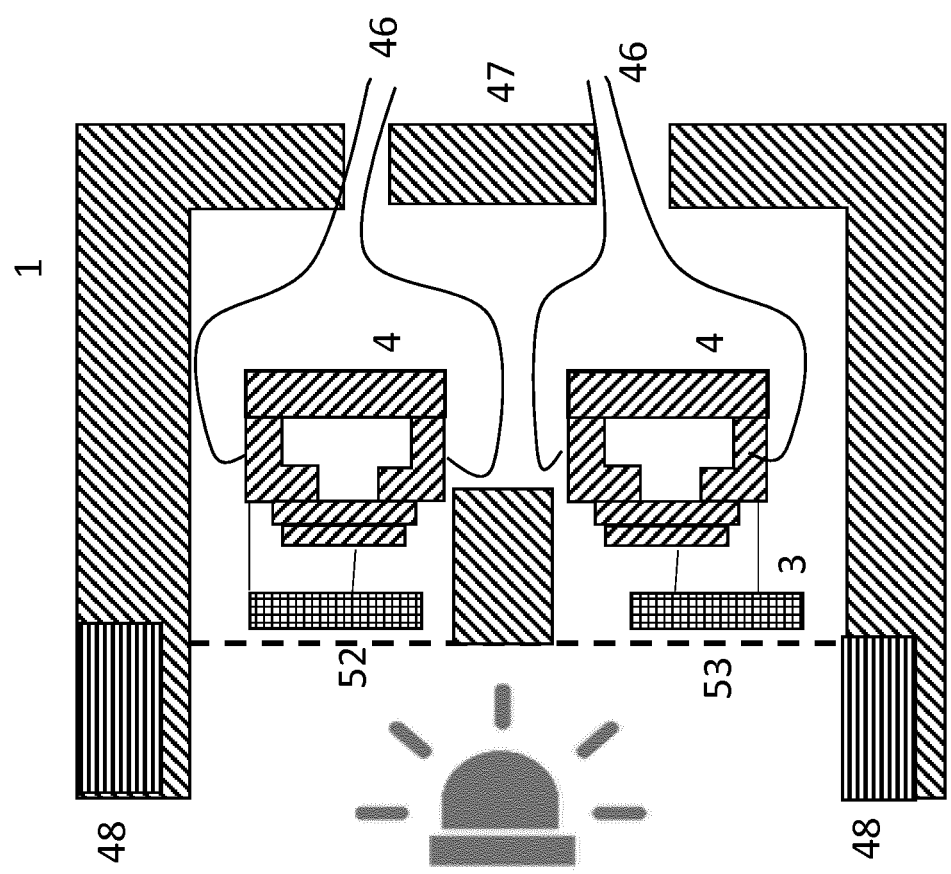
FIG. 5 depicts an installation incorporating two of the sensors of the embodiment of FIG. 4.

The embodiments may be adapted to monitor lamps which change color to indicate different operating states, by arranging for the sensor 3 coupled to the indicator lamp 9 to be sensitive to the wavelength corresponding to one operating state but not the other. In some embodiments, as shown in FIG. 5 and FIG. 7, multiple sensors are used, each sensitive to a respective wavelength, as a single sensor would not distinguish between failure of the indicator and illumination at the color to which it is not sensitive (a "false negative"). The different sensitivities may be selected by using photosensors 3 responsive to the appropriate wavelengths, or by using suitable optical filters 52, 53 as shown in FIG. 5, or light pipes 50, 51 having different optical properties as shown in FIG. 7.

The invention claimed is:

1. A transducer for detecting the state of a light source, comprising:
a passive photoelectric sensor generating an electric potential in response to incident light, coupled to a field-effect transistor (FET) which switches between distinct on and off states at a threshold potential, wherein the FET is connected to an electrical storage device arranged to be charged up by the photoelectric sensor, and to be switched to discharge to a further circuit, by the FET when the light sources ceases to be illuminated.

2. The transducer according to claim 1, wherein the on and off states are defined in terms of resistance, wherein one of the on state or the off state is a resistance on the order of megohms and the other of the on state or the off state is on the order of less than 100 ohms.

3. The transducer according to claim 1, wherein the FET is an enhancement-mode metal-oxide-semiconductor FET.

4. The transducer according to claim 1, wherein the FET is a depletion-mode metal-oxide-semiconductor FET.

5. The transducer according to claim 1, wherein the transducer is electrically coupled to a controller having a transistor switch responsive to an output of the FET.

6. The transducer according to claim 1, wherein the photoelectric sensor is mounted in a housing shaped to enclose an indicator lamp and exclude light from other sources from reaching the photoelectric sensor.

7. The transducer according to claim 6, wherein the housing is fitted with magnets to secure the housing to an instrument housing.

8. The transducer according to claim 1, wherein the photoelectric sensor is optically coupled to a light pipe, the light pipe being arranged, at an end of the light pipe remote from the photoelectric sensor, to be coupled to an indicator lamp.

9. An assembly of two or more of the transducers according to claim 8, wherein the respective photoelectric sensors of the two or more transducers are responsive to different wavelengths.

10. The transducer according to claim 1, wherein the photoelectric sensor is responsive to a first wavelength of light to generate a current and not responsive to a second wavelength of light.

11. The transducer according to claim 10, wherein the photoelectric sensor has an optical filter.

\* \* \* \* \*